(12) United States Patent  
Swanton

(10) Patent No.: US 8,738,310 B2  
(45) Date of Patent: May 27, 2014

(54) AUTOMATIC DETERMINATION OF BASELINES FOR BATTERY TESTING

(76) Inventor: Paul Swanton, Cupertino, CA (US)

( * ) Notice: Subject to any disclaimer, the term of this patent is extended or adjusted under 35 U.S.C. 154(b) by 313 days.

(21) Appl. No.: 12/963,500

(22) Filed: Dec. 8, 2010

(65) Prior Publication Data

US 2012/0150464 A1  Jun. 14, 2012

(51) Int. Cl.
*G01R 31/36* (2006.01)
*G01R 27/00* (2006.01)
*G08B 21/00* (2006.01)

(52) U.S. Cl.
USPC .................. 702/63; 324/600; 340/636.19

(58) Field of Classification Search
USPC ........... 702/63, 57–60, 64–68, 70–73, 75, 81, 702/84–85, 99, 117, 127, 130–131, 136, 702/179, 181–185, 189, 193; 320/116, 118, 320/120, 124–125, 127, 130, 132, 134, 136, 320/166; 324/76.11–76.13, 76.65–76.67, 324/426–427, 429–434, 600–603, 605, 650, 324/691; 340/635, 636.1, 636.11–636.12, 340/636.15–636.16, 636.18–636.19, 340/636.21, 657–658, 660–663; 374/100, 374/102, 137
See application file for complete search history.

(56) References Cited

U.S. PATENT DOCUMENTS

| | | | |
|---|---|---|---|
| 5,140,269 A | 8/1992 | Champlin | |
| 5,574,355 A | 11/1996 | McShane et al. | |
| 5,757,192 A | 5/1998 | McShane et al. | |
| 6,023,150 A * | 2/2000 | Patino et al. | 320/132 |
| 6,051,976 A | 4/2000 | Bertness | |
| 6,081,098 A | 6/2000 | Bertness et al. | |
| 6,091,245 A | 7/2000 | Bertness | |
| 6,104,167 A | 8/2000 | Bertness et al. | |
| 6,172,505 B1 | 1/2001 | Bertness | |
| 6,313,608 B1 | 11/2001 | Varghese et al. | |
| 6,323,650 B1 | 11/2001 | Bertness et al. | |
| 6,329,793 B1 | 12/2001 | Bertness et al. | |
| 6,411,098 B1 | 6/2002 | Laletin | |
| 6,466,026 B1 | 10/2002 | Champlin | |
| 6,566,883 B1 | 5/2003 | Vonderhaar et al. | |
| 6,633,165 B2 | 10/2003 | Bertness | |
| 6,707,303 B2 | 3/2004 | Bertness et al. | |
| 6,805,090 B2 | 10/2004 | Bertness et al. | |
| 6,806,716 B2 | 10/2004 | Bertness et al. | |
| 6,832,171 B2 | 12/2004 | Barsoukov et al. | |

(Continued)

FOREIGN PATENT DOCUMENTS

EP  1206826 B1  2/2009

OTHER PUBLICATIONS

Langan, Peter E., The Art of Impedance Testing, 1999 IEEE, pp. 121-128.*

(Continued)

*Primary Examiner* — Toan Le
(74) *Attorney, Agent, or Firm* — Peters Verny, LLP

(57) ABSTRACT

Baseline values for battery testing are automatically determined for individual batteries, battery cells, or networks of batteries. Impedance information is obtained from individual batteries and adjusted for operating conditions at a site of use (e.g., temperature, age, connection topology and user-entered information). Population-referenced baselines are automatically calculated from the group of individual-referenced baselines. All baselines can be continually updated and improved. SOC and SOH characteristics of batteries in the network can be automatically determined by comparison of measured impedance, and other, values to said baselines.

56 Claims, 8 Drawing Sheets

(56) References Cited

U.S. PATENT DOCUMENTS

| | | |
|---|---|---|
| 6,871,151 B2 | 3/2005 | Bertness |
| 6,885,195 B2 | 4/2005 | Bertness |
| 6,906,523 B2 | 6/2005 | Bertness et al. |
| 6,930,485 B2 | 8/2005 | Bertness et al. |
| 6,990,422 B2 | 1/2006 | Laletin et al. |
| 7,003,411 B2 | 2/2006 | Bertness |
| 7,081,755 B2 | 7/2006 | Klang et al. |
| 7,253,680 B2 | 8/2007 | Laletin |
| 7,398,176 B2 | 7/2008 | Bertness |
| 7,446,536 B2 | 11/2008 | Bertness |
| 7,479,763 B2 | 1/2009 | Bertness |
| 7,557,586 B1 | 7/2009 | Vonderhaar et al. |
| 7,595,611 B2 | 9/2009 | Reynier et al. |
| 7,595,643 B2 | 9/2009 | Klang |
| 7,598,699 B2 | 10/2009 | Restaino et al. |
| 7,598,743 B2 | 10/2009 | Bertness |
| 7,598,744 B2 | 10/2009 | Bertness et al. |
| 7,656,162 B2 | 2/2010 | Vonderhaar et al. |
| 7,688,074 B2 | 3/2010 | Cox et al. |
| 7,705,602 B2 | 4/2010 | Bertness |
| 7,706,991 B2 | 4/2010 | Bertness et al. |
| 7,710,119 B2 | 5/2010 | Bertness |
| 7,723,993 B2 | 5/2010 | Klang |
| 7,728,597 B2 | 6/2010 | Bertness |
| 7,772,850 B2 | 8/2010 | Bertness |
| 7,777,612 B2 | 8/2010 | Sampson et al. |
| 7,786,702 B1 | 8/2010 | Chait et al. |
| 7,786,734 B2 | 8/2010 | Andersson |
| 7,791,348 B2 | 9/2010 | Brown et al. |
| 7,808,131 B2 | 10/2010 | Hurst et al. |
| 7,808,375 B2 | 10/2010 | Bertness et al. |
| 7,924,015 B2 | 4/2011 | Bertness |
| 7,940,052 B2 | 5/2011 | Vonderhaar et al. |
| 7,940,053 B2 | 5/2011 | Brown et al. |
| 7,959,476 B2 | 6/2011 | Smith et al. |
| 7,977,914 B2 | 7/2011 | Bertness |
| 7,999,505 B2 | 8/2011 | Bertness |
| 8,164,343 B2 | 4/2012 | Bertness |
| 8,190,383 B2 | 5/2012 | Chen et al. |
| 8,190,384 B2 | 5/2012 | Zhang et al. |
| 8,192,789 B2 | 6/2012 | Albano et al. |
| 8,198,759 B2 | 6/2012 | Hurst et al. |
| 8,198,900 B2 | 6/2012 | Bertness et al. |
| 8,203,345 B2 | 6/2012 | Bertness |
| 8,237,407 B2 | 8/2012 | Hurst et al. |
| 8,237,448 B2 | 8/2012 | Bertness |
| 8,306,690 B2 | 11/2012 | Bertness et al. |
| 8,344,685 B2 | 1/2013 | Bertness et al. |
| 8,357,464 B2 | 1/2013 | Sastry et al. |
| 8,436,619 B2 | 5/2013 | Bertness et al. |
| 8,442,877 B2 | 5/2013 | Bertness et al. |
| 8,471,520 B2 | 6/2013 | Coe et al. |
| 8,493,022 B2 | 7/2013 | Bertness |
| D687,727 S | 8/2013 | Kehoe et al. |
| 8,513,949 B2 | 8/2013 | Bertness |
| 8,516,429 B2 | 8/2013 | Wu |
| 2003/0088375 A1 | 5/2003 | Bertness et al. |
| 2004/0145352 A1 | 7/2004 | Harrison |
| 2007/0252435 A1 | 11/2007 | Coe et al. |
| 2010/0201320 A1 | 8/2010 | Coe et al. |
| 2011/0218747 A1 | 9/2011 | Bertness |
| 2011/0300416 A1 | 12/2011 | Bertness |
| 2011/0309800 A1 | 12/2011 | Bertness |
| 2012/0041697 A1 | 2/2012 | Stukenberg |
| 2012/0041698 A1 | 2/2012 | Zhang et al. |
| 2012/0079710 A1 | 4/2012 | Bertness |
| 2012/0105066 A1 | 5/2012 | Marvin et al. |
| 2013/0087624 A1 | 4/2013 | Bertness et al. |
| 2013/0158782 A1 | 6/2013 | Bertness et al. |

OTHER PUBLICATIONS

Christen, Thomas, et al., Energy-power relations of supercaps from impedance spectroscopy data, Dec. 1999, 5 pages.

Christen, Thomas, et al., Theory of Ragone plots, Journal of Power Sources 91 (2000), pp. 210-216.

Fasih, Ahmed, Modeling and Fault Diagnosis of Automotive Lead-Acid Batteries, Apr. 2, 2006, pp. 1-94.

Gieraci, James, et al., Using the Cell Broadband Engine to Compute an Electrochemical Battery Model, Massachusetts Institute of Technology, 1-6, 2007.

Grube, Ryan J., Automotive Battery State-of-Health Monitoring Methods, Wright State University, 2008, pp. 1-116.

Hindin, Barry S., Silver Corrosion Rates Measured by Resistivity Techniques in Flowing Mixed Gas Environments, 2005 Tri-Service Corrosion Conference, pp. 1-11.

Huang, Rongwen, Estimation of State-of-Charge of Lead-Acid Batteries Using Electrochemistry Theorem, MSME International Journal, Series C, vol. 49, No. 1, 2006, pp. 265-271.

Invention Disclosure, Addendum to dislosure p. 88, Temperature monitoring, Aug. 29, 2007, 1 page.

Invention Disclosure, Europa Meeting, Aug. 13, 2007, pp. 1-5.

Invention Disclosure, Instrument for detection of positive grid and/or current collector bus bar corrosion, Sep. 15, 2007, pp. 1-3.

Kim, Ui Seong, et al., Modeling of the capacity loss of a 12 V automotive lead-acid battery due to ageing and comparison with measurement data, Journal of Power Sources 190 (2009) pp. 184-188.

Maia, G., et al., A modelling approach to the optimization of lead-acid battery electrodes, Journal of Applied Electrochemistry 23 (1993), pp. 1151-1161.

Marahleh, G., et al., Creep-Life Prediction of Service-Exposed Turbine Blades, Materials Science, vol. 42, No. 4, 2006, pp. 476-481.

Morimoto, Y., et al., Computer Simulation of the Discharge Reaction in Lead-Acid Batteries, I-BIEM, vol. 135, No. 2, J. Electrochem. Soc: Electrochemical Science and Technology, Feb. 1988, pp. 293-298.

Papazov, G., et al., Influence of the Lead Dioxide Active Mass on the Corrosion Rate of the Spines of Positive Lead-Acid Battery Plates, Journal of Power Sources, 6 (1981) pp. 15-24.

Robinson, R. S., System noise as a signal source for impedance measurements on batteries connected to operating equipment, Journal of Power Sources, 42 (1993), pp. 381-388.

Rogatchev, T., et al., The Effect of Current Denisty and Thickness of the Active Mass Upon the Corrosion Rate of the Spines of Lead-Acid Battery Plates, Journal of Power Sources, 10 (1983), pp. 291-303.

Ruetschi, Paul, Aging mechanisms and service life of lead-acid batteries, Journal of Power Sources 127 (2004) pp. 33-44.

Stigh, U., Continuum Damage Mechanics and the Life-Fraction Rule, ASME Journal of Applied Mechanics, Sep. 2005, pp. 1-10.

Stigh, U., Continuum Damage Mechanics and the Life-Fraction Rule, ASME, vol. 73, Jul. 2006, pp. 702-704.

Sunu, Won G., et al., Mathematical Model for Design of Battery Electrodes, J. Electrochem. Soc.: Electrochemical Science and Technology, Apr. 1982, pp. 688-695.

Tinnemeyer, Jorn, A., 31-4: Diamagnetic Measurements in Lead Acid Batteries to Estimate State of Charge, Journal of Power Sources04312010, 4 pages, 2010.

Vaaler, L. E., et al., Computerized design and evaluation of improved electrodes for lead-acid batteries, Journal of Applied Electrochemistry 12 (1982), pp. 721-734.

* cited by examiner

AUTOMATIC DETERMINATION OF BASELINES FOR BATTERY TESTING

FIELD OF THE INVENTION

The present invention relates generally to testing electronic components.

BACKGROUND

Equipment for measuring phase-sensitive impedance or admittance (collectively, vector parameters), or phase-insensitive resistance or conductance (collectively, scalar parameters) on batteries, particularly, but not limited to, lead-acid batteries, is widely available. Technical expertise is often needed to interpret the raw data outputted by such instruments, and to understand the implications of the data for battery maintenance and replacement.

It is presently not possible to accurately and consistently correlate impedance parameters with a condition of a battery, such as state of charge (SOC), or retained capacity (RC), cold cranking amps (CCA), or with post-mortem assessments of failure modes such as sulfation, dryout, or electrolyte decomposition (all broadly categorized as State of Health (SOH) characteristics), without using some sort of reference value as a baseline with which to compare parameter readings obtained. The accuracy of determinations of a SOC or SOH condition is dependent on the accuracy of the baseline used. However, there is at present no entirely satisfactory method available for obtaining baseline values for measured vector and scalar parameters of batteries.

This same fundamental need for a baseline reference applies whether the user is attempting to determine a condition of an individual battery, of a battery in a network, or of a network of batteries as a whole. It applies when the user is attempting to screen a population of non-networked batteries for purposes such as deciding whether to include the individual batteries in a network. It also applies whether the user is utilizing a snapshot or a continuous approach to testing.

Some battery manufacturers, and some battery test equipment manufacturers, publish reference lists of typical conductance or other scalar parameters for specific battery models in an effort to address this issue. The assumption is made that a reference scalar parameter value obtained from a generic, new battery will provide a valid baseline. But, there are several problems with reference lists derived under pristine conditions from battery samples that are not specific to the actual device during actual use in the field.

First, scalar parameter measurements tend to be instrument-specific, as there is a wide variety of techniques and frequencies used by the different manufacturers, and it is well known in the industry that the results from different instruments, and even different instruments of the same make and model, are far from identical.

Second, although a typical scalar reference parameter value derived in this way represents the mean for a large number of batteries, values for individual batteries can deviate widely from the mean. In fact the range of values found among nominally identical batteries from a single manufacturer often exceeds the range in values expected for a single healthy battery over its lifespan. Furthermore, average parameter values can change substantially with even minor manufacturing changes.

Third, the temperature dependence of reference values is typically not considered. Vector and scalar measurements of electrochemical systems vary markedly with temperature. This variation is typically not taken into account with published reference values.

Fourth, reference values collected under ideal conditions may bear little similarity to the true reference values for individual batteries in their operating environment. At a minimum, these reference values are universally collected on batteries at open circuit potential, while many field measurements are done on batteries being actively charged, which changes the vector and scalar measurement parameters of the battery. Furthermore, it is well known in the industry that most types of battery, and particularly lead acid batteries, undergo the final stages of their formation processes after they enter use. The vector and scalar parameters of the battery will change with these final bedding in stages and any accurate reference value must take account of these changes.

Fifth, published reference scalar parameter values typically refer to a single frequency point, or to a single DC measurement value. Multi-frequency battery testing equipment is now emerging, with a potentially infinite number of frequencies at which both scalar and vector parameters can be measured. These parameters may vary markedly with frequency. Thus a single scalar reference value offers minimal or no utility to these instruments.

Therefore, what is needed are techniques for automatically determining baselines for battery testing of batteries under actual operating conditions and specific to the test instrument model in use, and the vector and scalar parameters, or any other measurement parameters, it is designed to measure.

SUMMARY

These needs are met by a method, system and computer program product for automatically determining baseline impedance parameter values for battery testing. The baseline values can be expressed as one or more vector or scalar quantities of Ohm units, or other units of vector and scalar measurement. In one embodiment, the baseline values are specific to the test instrument, to the battery or network of batteries, and to their operating environment at a site of use. The baseline values can be determined for a network of batteries, for individual batteries within the network of batteries, or for cells within an individual battery.

In one embodiment, impedance information is obtained from individual batteries or cells within the network of batteries by analyzing the response to a sinusoidal excitation signal at one or more frequencies, when the network is in use or "live", in its topology of use, with elements providing charge and acting as potential loads fully connected. The impedance information collected under these conditions automatically compensates for the variations due to network topology or other operating conditions. From the impedance information, individual-referenced baselines can be calculated for each of the batteries. The individual-referenced baselines are adjusted for operating conditions at a site of use (e.g., temperature, battery age, or other user-entered information). Population-referenced baselines can then be calculated from the set of individual-referenced baselines.

In some embodiments, the population-referenced baseline is updated by impedance parameter values of the network of batteries measured at different points in time, which process may occur relatively frequently, or widely separated in time, and which can result in the convergence of baselines on the most accurate possible value. In other embodiments, the population-referenced baseline is an input to determining a condition of batteries or cells within the network, or of the network of batteries as a whole.

In some embodiments, other non-impedance information is used as part of the baseline, in addition to impedance data, including but not limited to battery temperature, terminal temperature, a differential in temperature between battery terminals, electrolyte specific gravity, state of charge as determined by coulomb counting, or voltage.

Advantageously, and critically, battery test results are tailored to operating conditions for a more accurate assessment of a condition of a battery. The battery results also take into account variations in testing equipment and battery manufacturing. The impedance information used in determining a battery condition, by comparison, to a baseline, is the same type of impedance information, and is derived by the same type of instrument or even the same instrument, as was used in determining that baseline.

BRIEF DESCRIPTION OF THE DRAWINGS

In the following drawings like reference numbers are used to refer to like elements. Although the following figures depict various examples of the invention, the invention is not limited to the examples depicted in the figures.

DETAILED DESCRIPTION

Figure 1:
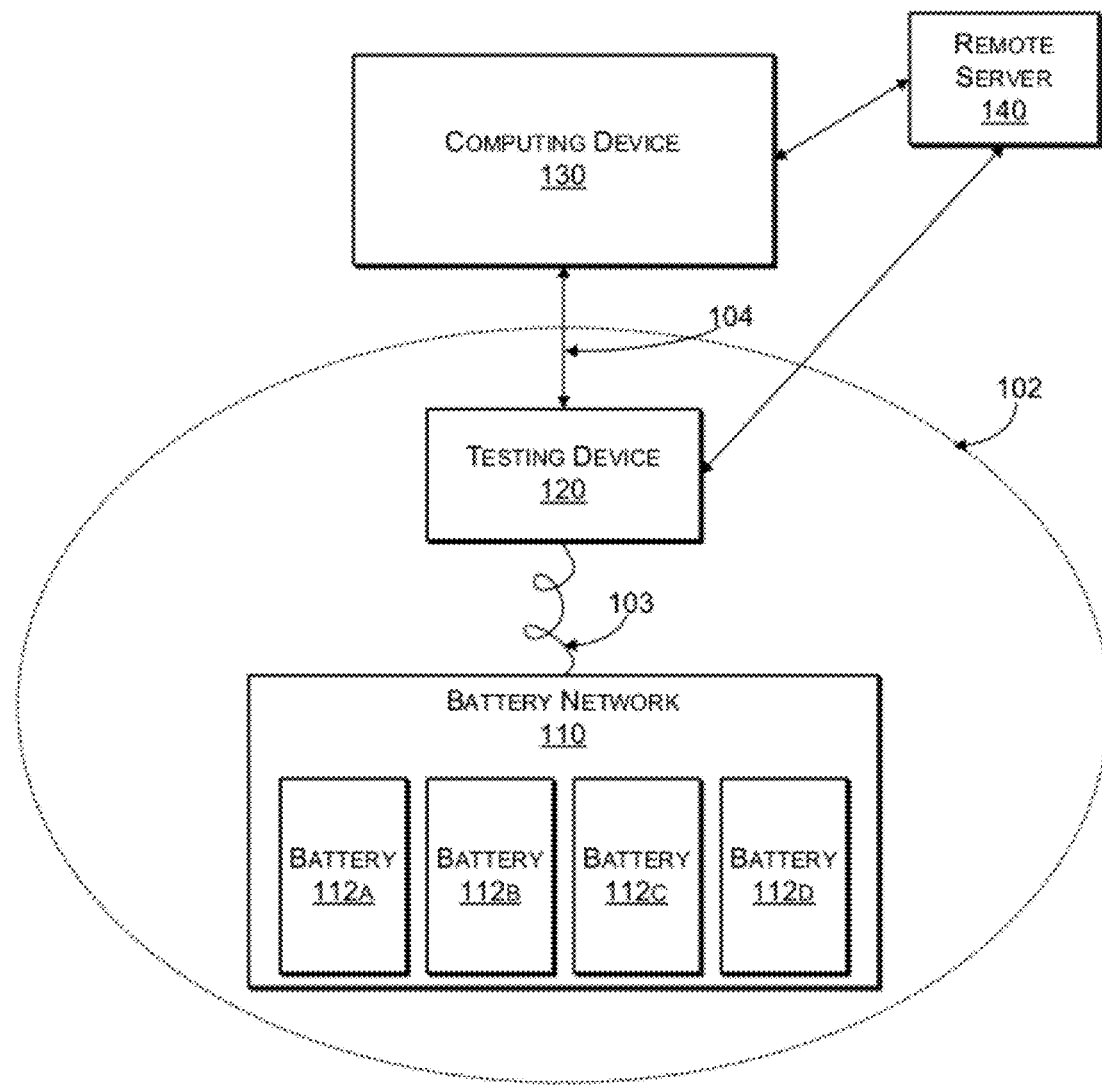
FIG. 1 is a block diagram illustrating a system to determine a baseline associated with a network of batteries, according to an embodiment of the present invention.

A system, method and computer program product for automatically determining the baseline reference values associated with a network of batteries is disclosed.

As used herein, a "battery" is understood to refer to the individual test element in a network or non-networked group of said elements, whether it be a single cell or a block of cells, or even the network of elements in its entirety.

As used herein, "network" is understood to refer to an array of electrochemical energy storage devices, typically batteries or cells, the individual elements of which are joined together in any type of series or parallel topology, or any combination thereof, and which may include electrical elements designed to provide charge to said energy storage devices, and also may include elements which will source power from said energy storage devices by acting as electrical loads.

As used herein, "baseline" is understood to refer to a reference value or values for an impedance, or other, parameter, representing the expected value of that parameter in a battery at its maximum or ideal SOH and SOC.

As used herein, an "individual-referenced baseline" is understood to refer to the baseline specific to any individual battery, which allows the user to measure and monitor the evolution of SOC and SOH characteristics of that battery over time by comparing it to measured or calculated impedance, or other, parameter values collected from that battery at various time intervals, among other uses.

As used herein, a "population-referenced baseline" refers to the baseline specific to a network of batteries connected together, and derived mathematically from the individual-referenced baselines of the individual batteries of the network. It allows the user to assess the uniformity of SOC and SOH characteristics of the batteries within the network, to detect population outliers, and to assess SOC and SOH characteristics of the network as a whole by comparing it to measured or calculated impedance, or other, parameter values obtained from the individual batteries of the network.

Furthermore, it is understood that when used alone herein, "baseline" refers to both individual-referenced and population-referenced baselines, unless the context makes it clear that this is not the case.

As used herein, "convergence" refers to an iterative process of baseline refinement by the incorporation of increasing amounts of data. Predictions are compared to actual measurements, and the outcome with each datum input will be expected to move the calculated baseline closer to the true value, but in a manner where oscillation about the true value may be seen. The true value will be that which allows a condition of a battery or a network, comprising a SOC or SOH characteristic, to be most accurately estimated by algorithmic interpretation of subsequent impedance, or other, measurements.

As used herein, "impedance", or "impedance parameter", are understood to refer to any measured vector or scalar parameter value or values, or any representation or construct mathematically derived from a measured vector or scalar parameter value or values, of an electrical or an electrochemical system, including but not limited to an energy-storage battery.

As used herein, "snapshot" data collection refers to intermittent data collection episodes using portable equipment, which episodes may be months or even years apart, and in which each data collection episode is interpreted in isolation. Meanwhile, "continuous" data collection or monitoring refers to data collected by equipment that is permanently mounted or embedded in the battery or battery network under investigation, to collect data points at relatively frequent intervals, and evaluate changes in data relatively continuously.

As used herein, "SOC" and "SOH" characteristics are considered "conditions" of a battery or network of batteries. When applied to an individual battery, they comprise a "condition" that affects or potentially affects the ability of the battery to perform to user requirements. When applied to a network of batteries, they comprise a "condition" that affects or potentially affects the ability of the network of batteries to perform to user requirements, regardless of how many individual batteries in the network are actually affected or potentially affected by the "condition". They include, but are not limited to, battery characteristics such as retained capacity, cold cranking amps, retained percentage of charge and fuel gauging of battery networks and packs, cycle life remaining, life fraction, overcharging and undercharging, infant mortality defects, or failure modes such as sulfation, dryout, or grid corrosion in lead acid batteries, failure modes such as electrolyte decomposition and current collector pitting in lithium-ion batteries, and failure modes such as separator degradation or positive electrode capacity decay in nickel cadmium or nickel metal hydride batteries, as well as any other failure modes of any type of battery.

As used herein, the "calendar age" of a battery refers to the fraction of the battery's manufacturer-defined expected useful life, in years, that has been used up.

As used herein, the "life fraction" of a battery refers to the fraction of the battery's functional life that has been used up.

FIG. 1 is a block diagram illustrating a system 100 to determine a baseline associated with a network of batteries, according to an embodiment of the present invention. The system 100 comprises a network of batteries 110, a testing device 120, a computing device 130, and a remote server 140. In one embodiment, the individual batteries in the network of batteries 110 are sequentially connected to the testing device 120 during testing at a site 102 via electrical cord 103. Further, the testing device 120 is connected to the computing device 130 during data transfer via channel 104 (e.g., a serial or parallel data cord, wired or wireless Ethernet channel, USB cord, FireWire cord, other wireless connection, or the like), and which connection 104 may be permanent. The computing device 130 and/or the testing device 120 may also communicate with a remote server 140, typically over a local area network or wide area network.

The network of batteries 110 includes one or more individual electrical elements, such as batteries, 112a-d. In one embodiment, the individual batteries 112a-d utilize lead acid chemistry, however, other battery chemistries can equally be used.

The individual batteries 112a-d can be of any voltage or capacity used for residential, commercial, industrial, military or other use. They will typically be rechargeable secondary batteries, but primary batteries are not excluded. They may be of any battery chemistry. A connection topology of the network of batteries 110 refers to a circuit configuration defining a flow of current between the main positive and negative terminals of the network of batteries 110. For example, the network of batteries 110 can be connected in series, in parallel, or any combination two. The network may have parallel charging circuitry and equipment, or parallel electric loads and associated circuitry, complicating the network topology. In one application, the network of batteries 110 can be in active use to power a mobile system, such as an electric-powered or hybrid-electric automobile, locomotive or crane. In one application, the network of batteries 110 can be in reserve use as backup power for a telecommunications system.

The testing device 120 can be, for example, a handheld device configured with hardware and firmware specific to battery testing. It may also be a device configured to be permanently attached to each battery, or to groups of batteries within the network of batteries 110, and also permanently attached to the computing device 130, and such that impedance parameter, and other, data are acquired and processed on a continuous or semi-continuous basis. In one embodiment, the testing device 120 generates and inputs a sinusoidal excitation signal or signals of known frequency or frequencies, and known current amplitude and phase, through each of the batteries in turn. The amplitude and phase shift of the voltage responses of the batteries to the excitation signals at the various frequencies are measured, and used to derive vector impedance parameter values for the battery. In other embodiments, the excitation signal can be a square wave or a triangle wave, or a voltage or a current step, and the testing device 120 derives vector or scalar impedance values for the battery from the battery's response to those excitation signals. In one implementation, the testing device 120 is also able to measure one or more temperatures, voltage, specific gravity, and other associated characteristics of the batteries in the network.

The computing device 130 can be a personal computer, a server blade, a laptop computer, a single-board computer, or any other type of processor-controlled device. In one implementation, the testing device 120 is used on site 102 for immediate, basic testing results while the computing device 130, having more processing power, a larger display and a more complete keyboard, can be used off site for further analysis and for baseline modification and adjustment. Data can be uploaded to the computing device 130 in batch after collection from the sites, or in real time through a wireless network connection, or other connection. Moreover, computing device 130 can be used to configure test settings and download them, and also data such as historical or adjusted baselines, to testing device 120. In one embodiment, the computing device 130 is part of a permanent, embedded continuous monitoring system for the network of batteries, and may also communicate with a remote server 140 which aggregates and may further process and analyze data from multiple battery networks, including baseline adjustment and modification.

Figure 2:
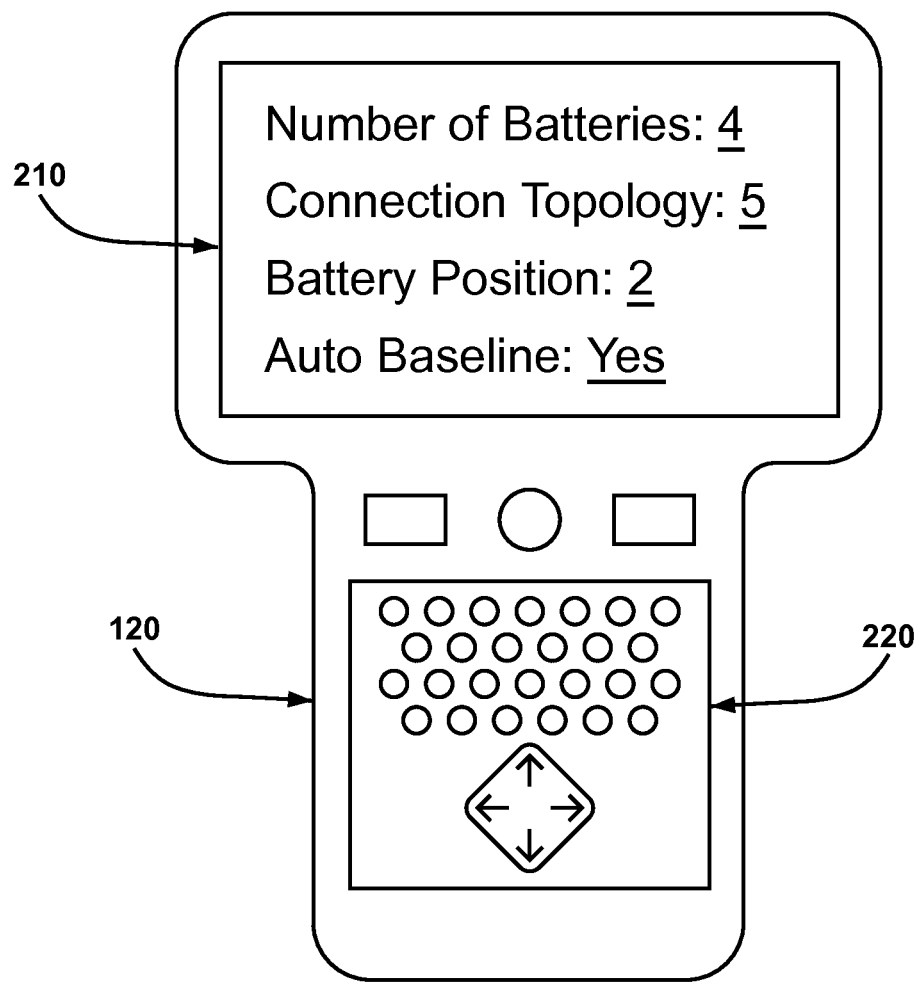
FIG. 2 is a schematic diagram illustrating a testing device of the system in FIG. 1, according to an embodiment of the present invention.

FIG. 2 is a schematic diagram illustrating an exemplary testing device 120 of the system in FIG. 1, according to an embodiment of the present invention. The testing device 120 is a handheld device designed for snapshot data collection and processing, and includes a display screen 210 and a keypad 220. It is understood that testing device 120 is merely an example which can be varied while remaining within the spirit of the present invention.

The testing device 120 can be enclosed in a casing made of suitable materials, such as durable plastic with a rubber grip for rugged environments. Additional components (not shown) within the casing are typical for a mobile computing device. Namely, a motherboard with a processor (e.g. a RISC, FPGA or ASIC processor), memory (e.g., Flash memory), an operating system (e.g., mobile version of Linux) and input/output components, as described below in reference to FIG. 3. In a specialized device, source code is preferably embedded in firmware.

In one implementation, a service person carries the testing device 120 from one site to another to be used in troubleshooting or maintenance of battery backup power installations. In another implementation, the testing device 120 is deployed in a laboratory environment in which operating conditions are simulated, as a research or development tool.

Figure 3:
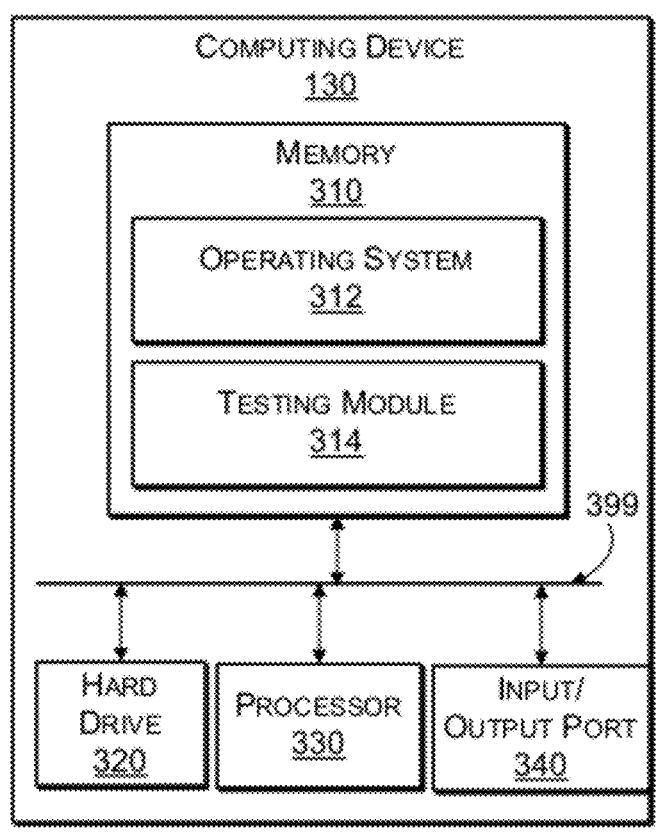
FIG. 3 is a block diagram illustrating a testing module of the system in FIG. 1, according to an embodiment of the present invention.

FIG. 3 is a block diagram illustrating a computing device 130 of the system 100 of FIG. 1, according to an embodiment of the present invention. The computing device 130 includes a memory 310, a hard drive 320, a processor 330 and an input/output port 340. Alternative configurations and additional components can serve the same functions as the computing device 130 shown.

The memory 310 can be any type of memory device used to store source code being executed. Examples include SRAM, DRAM, Flash, and the like. An operating system 312 such as Windows, Mac OS or Linux can execute in memory along with various application software such as a testing module 314.

The testing module 314, in one embodiment, provides deeper analysis for data collected at various sites and a user interface. A user interface permits a user to, for example, generate graphs and manually manipulate the data, as described in more detail below.

The testing module 314, in another embodiment, through specialized embedded code provides the ability to monitor and observe, as well as to manage, data, baselines, and various conditions affecting the network of batteries to which it is permanently attached as part of an embedded, continuous monitoring system. It may also communicated with a remote server 140 which allows a user to, at a single location, view, aggregate, further process and analyze, data from multiple battery networks in real time, as well as to manage those networks based on the information received.

Figure 4:
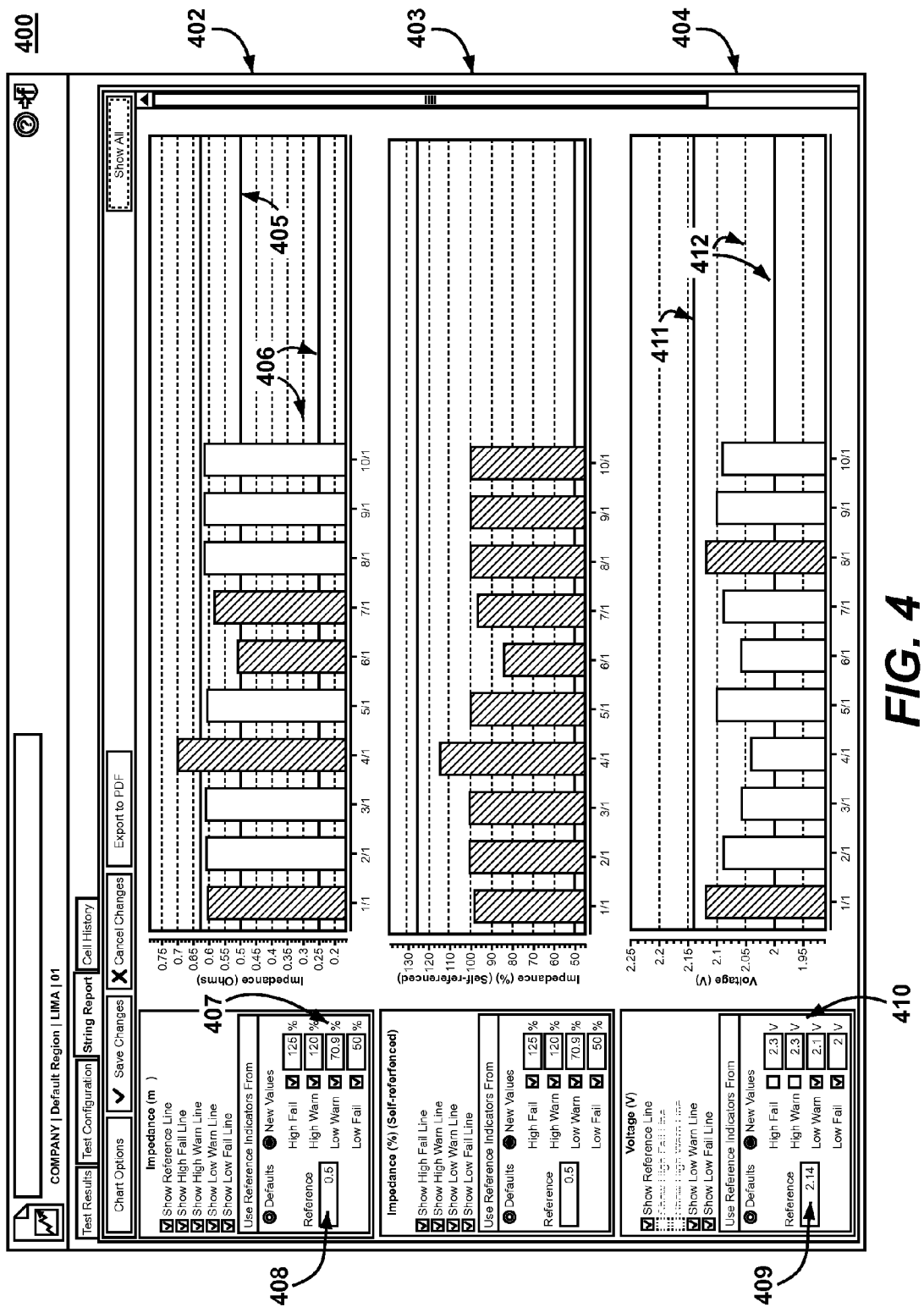
FIG. 4 is a schematic diagram illustrating individual impedance and other information for a network of batteries and resulting baselines, according to an embodiment of the present invention.

FIG. 4 is a schematic diagram illustrating one example of a user interface 400 to the computing device 130. The computing device 130 can receive information from the testing device 120 and display it on the user interface 400. Individual batteries are plotted in graphic form in the different graphs along an x-axis, while several measured and calculated impedance, and other, values are plotted along a y-axis. Graph 402 shows the measured impedance value for each battery (in this case, the vector real impedance response at a specific frequency), with the automatically-calculated population-referenced baseline 408 shown as the green reference line 405. Warning and fail alarm lines, which represent threshold deviations from the population-referenced baseline and which can be correlated to a battery condition, are shown 406, and their values as percentages 407 of the population-referenced baseline value 408. The reference line 405 may be moved up and down by the skilled user, as part of the process of convergence, adjusting the population-referenced baseline 408, and the alarm lines 406 will follow automatically. The alarm percentage values 407 may also be adjusted individually.

Graph 403 shows the same measured impedance of each battery in the network, but in this case presented as a percentage change from its individual-referenced baseline value. Alarm lines are again shown, and again they represent threshold deviations, but from the individual-referenced baseline, and Again they can be correlated to a battery condition. No reference line is necessary, as the individual-referenced baseline is by definition 100%. The presentation allows the user to easily visualize changes from baseline in individual batteries.

Graph 404 shows the measured voltage, a non-impedance parameter carrying information about SOC and SOH characteristics, of each battery. Again, reference 409 and alarm 410 values are shown and graphed as lines 411 and 412 respectively. The reference value 409 can be considered an automatically-calculated population-referenced baseline, and can again be adjusted by the skilled user as part of the process of convergence. Again, the alarm lines 412 represent threshold deviations from the population-referenced baseline and can be correlated to a battery condition.

Figure 5:
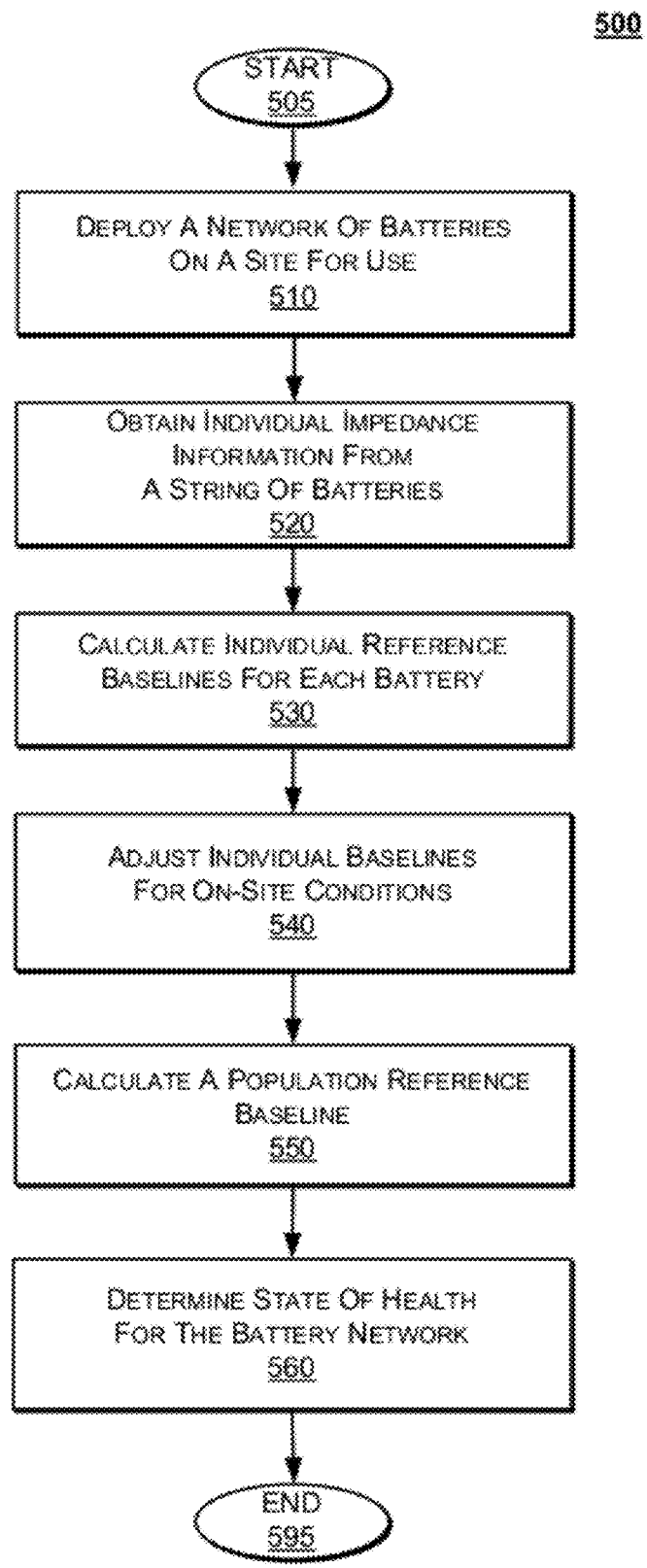
FIG. 5 is a flow diagram illustrating a method for automatically determining baselines associated with a network of batteries, according to an embodiment of the present invention.

FIG. 5 is a flow diagram illustrating a method for determining baselines associated with a network of batteries, according to an embodiment of the present invention. The method can be implemented in the system 100 of FIG. 1.

A network of batteries is deployed 510 on a site for use. The group can be deployed together, or individual batteries can be switched out as needed. The batteries can be, for example, active in powering an electrical system, or can be used to backup a grid-powered electrical system in case of a power failure.

As a procedure for troubleshooting or regular preventative maintenance, the deployed batteries are tested to ensure performance. To do so, individual impedance, based on the measured response of each battery to a known excitation signal information is obtained 520 from batteries within a network.

An individual-referenced baseline is calculated for each battery 530, based on the measured impedance values.

The individual-referenced baselines are adjusted 540 for factors such as, but not limited to, on site operating conditions including temperature, calendar age, connection topology and user-entered information. These adjustments are described in more detail with reference to FIG. 6. Adjustment proceeds by a combination of user inputs and automated processing.

A population-referenced baseline for the network as a whole is calculated 550 from the group of individual-referenced baselines, as described more fully below in reference to FIG. 7.

In one embodiment, a condition, comprising a SOC or SOH characteristic, may be determined 560 for individual batteries or cells, or for the network of batteries as a whole, by algorithmically comparing the impedance values measured for each battery to the population-referenced baseline. In this case, the impedance information compared to the population-referenced baseline will comprise the individual-referenced baselines of each battery. More specifically, variations in these impedance values can indicate the presence and magnitude of a condition. Degradation or failures can occur due to, for example, sulfation, dryout, grid corrosion, or manufacturer defects. Also, disparities in battery SOH can and do affect the overall health of a network, and its ability to deliver adequate power when required, by overburdening healthy batteries.

Note that the method 500 is a snapshot for one iteration of the process of determining baselines. In one embodiment, embedded continuous monitoring supplies repeated snapshots for additional iterations. The baselines are updated and made increasingly accurate in a process of convergence, as described more fully below in reference to FIG. 8.

Figure 6:
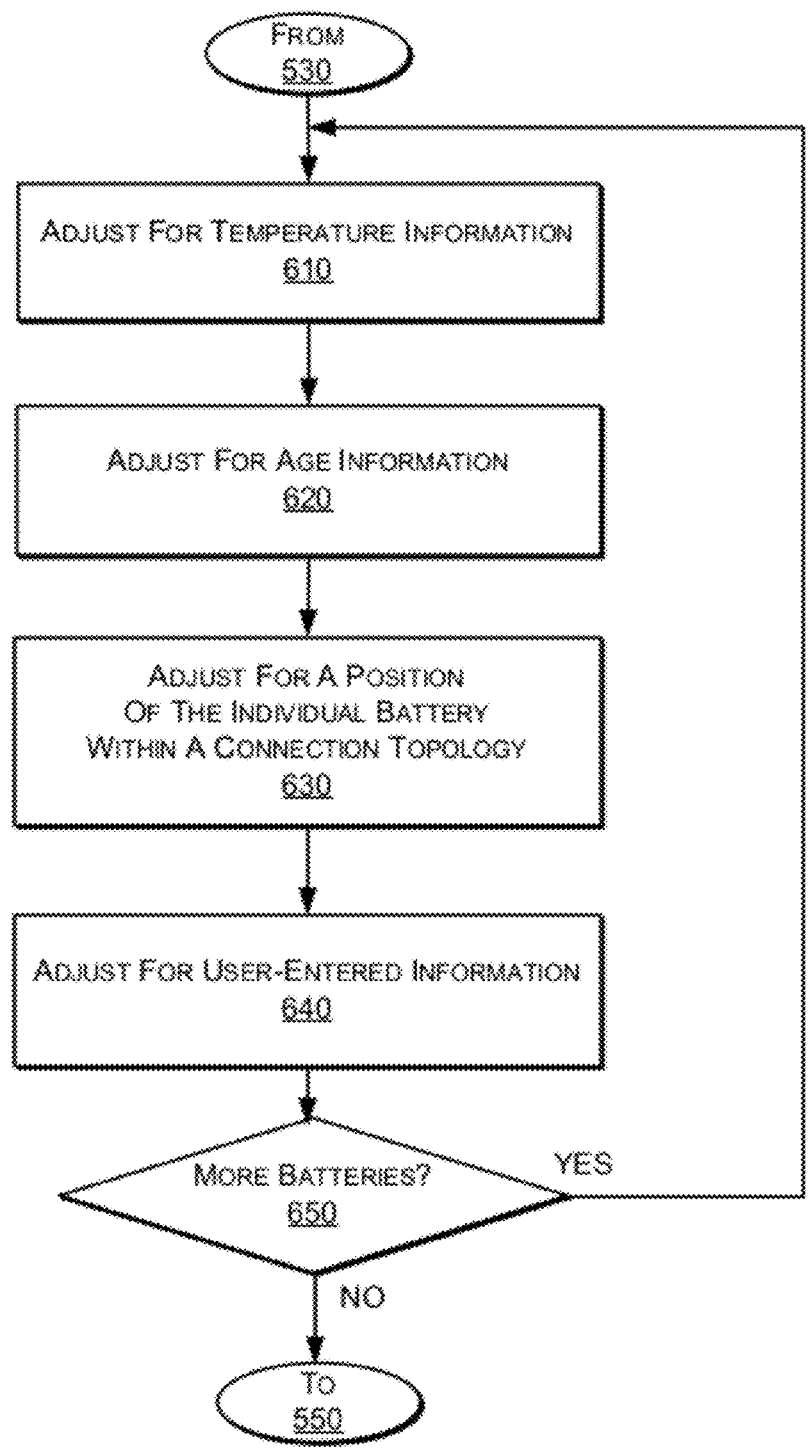
FIG. 6 is a flow diagram illustrating a method for determining an individual-referenced baseline, according to an embodiment of the present invention.

FIG. 6 is a flow diagram illustrating an example method 540 for determining an individual-referenced baseline, according to an embodiment of the present invention. In the embodiment shown, the individual-referenced baseline is adjusted 610 for battery temperature. Alongside the impedance measurement, temperature of the battery is measured, in any one of a number of ways, as the impedance parameters will vary markedly, but predictably, with temperature.

Individual-referenced or population-referenced baselines can also be adjusted 620 to account for a battery calendar age. Impedance tends to change, in a predictable manner, with battery calendar age. Consequently, a baseline can be adjusted to an age of a battery to ultimately enable more accurate determinations of conditions such as SOC and SOH characteristics of the battery or of a network. Of particular interest, this adjustment is necessary to enable the determination of a battery life fraction, a condition of significant interest in battery monitoring.

Furthermore, some embodiments adjust 630 individual-referenced baselines for a position of the individual battery within a connection topology. Impedance information can be affected by parallel versus series connections, the number of batteries in a series network, the position of a battery in a network, the configuration of battery interconnects, the position in the string relative to attached charging apparatus or electrical loads, and the like. Any battery that is part of a network which includes parallel connection of parts of the network will be expected to have an impedance lower than would be the case without those parallel elements, for example. A battery which is the terminal element in a series-connected network will be expected to have lower impedance than other batteries within the network, as another example. A battery which, by dint of its position in the network topology has battery connection hardware applied to its terminals in different configuration from that typical for the batteries in the network, and particularly a battery with multiple positive and negative terminals, may show a different apparent measured impedance due to the effects of shunting by the connection hardware, as a further example.

In one embodiment, individual-referenced baselines are also adjusted 640 for user-entered information. For example, a user can provide historical data for measured impedance values that he wishes to use as individual-referenced or population-referenced baselines. In another example, a user can override automatically calculated baselines in favor of self-calculated or manufacturer-provided values. In a further example, a user can indicate that he does not want the individual-referenced baseline for a particular battery or batteries to be used in calculating the population-referenced baseline, or alternatively that a particular individual-referenced baseline should be weighted in some way, such as over- or under-weighted, in calculating the population-referenced baseline.

Those skilled in the art will recognize that adjustments for certain characteristics of the operating environment, and certain variations in test instruments used, will be inherently accounted for during testing on-site without the need for an explicit adjustment. For example, differences between impedance readings obtained with test equipment from different manufacturers, or of different models from the same manufacturer, or even of individual representatives of a single model of testing device, are avoided by automatically generating a baseline using the same equipment that will be used in testing the batteries in future. Likewise, differences in network topology will be dealt with at the individual-referenced baseline level, although not at the population-referenced baseline level, by on-site baseline determination. Further, the impedance information used in determining a battery condition, by comparison, to a baseline, is the same type of impedance information as was used in determining that baseline.

Figure 7:
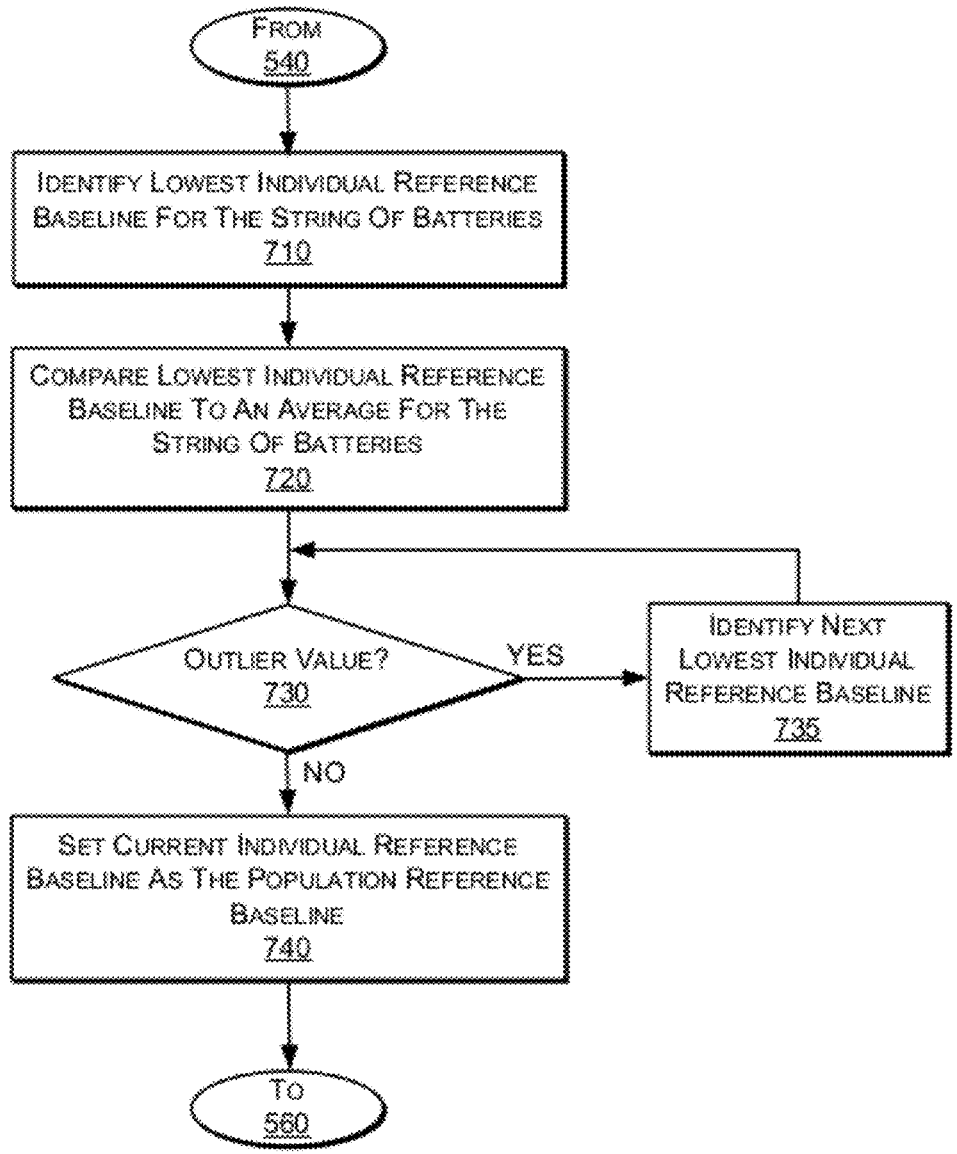
FIG. 7 is a flow diagram illustrating a method for determining a population-referenced baseline, according to an embodiment of the present invention.

FIG. 7 is a flow diagram illustrating an example of a method 550 for determining a population-referenced baseline, according to an embodiment of the present invention. More specifically, the most extreme individual-referenced baseline, in the direction generally indicative of an ideal SOH for the batteries in the network, is algorithmically identified 710 for automated comparison 720 against an average value for a particular defined subgroup of the network of batteries, to determine whether it is an outlier or a legitimate member of the distribution of baselines within the network.

If the most extreme individual-referenced baseline is ruled an outlier value 730, it is disregarded in favor of the next-most extreme value 735, which is in turn algorithmically tested to determine whether it is an outlier, and the process is iteratively repeated until a non-outlier baseline is identified. The determination of outliers is implementation specific. One implementation ignores outliers more than 5% below the average of the defined subgroup.

Once the most extreme individual-referenced baseline that is not an outlier is identified, it is set 740 as the population-referenced baseline.

It should be noted that this is just one of many possible approaches to the automated calculation of a population-referenced baseline 550. A baseline will not necessarily be a most extreme value, it may be a median or average value, for example in the case of screening batteries for latent defects.

It is understood that the determination of conditions such as SOC and SOH characteristics of the batteries in the network 560 is a primary and immediate goal of the user. However, it is equally recognized that the accuracy of the qualification and quantification of these characteristics is dependent on the quality of the baseline or baselines used. Further, the more information that is available about individual batteries, the more accurate can the baselines for those batteries be expected to be.

Figure 8:
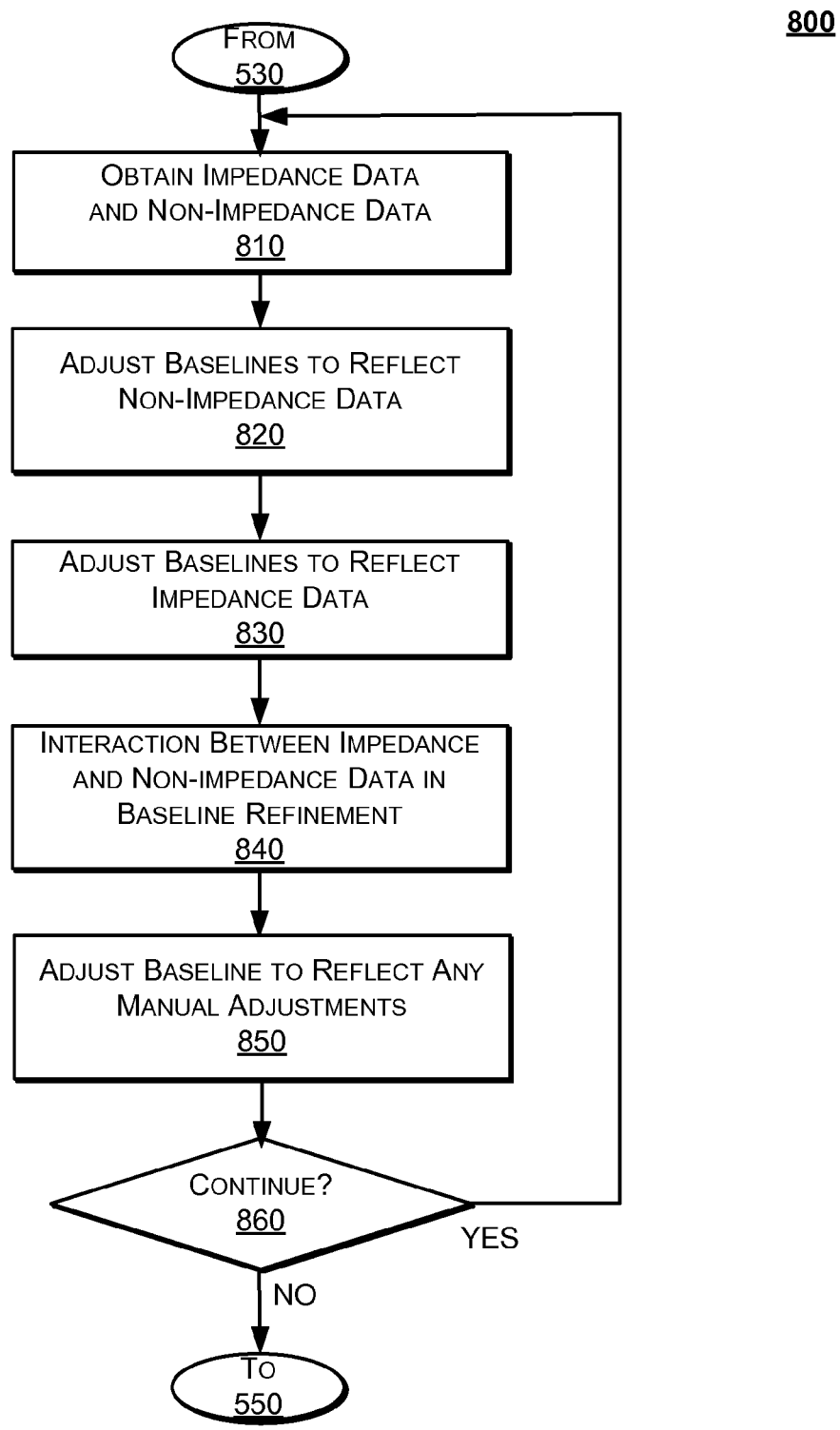
FIG. 8 is a flow diagram illustrating a method for adjusting individual-referenced baselines, both manually and automatically, in the light of further collected impedance data and by a process of convergence, according to an embodiment of the present invention.

FIG. 8 is a flow diagram illustrating the incorporation of further data into the baselines for the network to make them, by a process of convergence, increasingly accurate. Impedance and non-impedance data, such as specific gravity (in flooded lead acid batteries, for example) or discharge capacity measurements, of individual batteries in the network can be obtained 810 and incorporated to automatically adjust baselines 820. Impedance data can also be used to automatically adjust baselines 830. Particularly, but not exclusively, in the case of continuous monitoring, the adjustments can be fine-tuned by feedback and interaction between impedance measurement data and non-impedance data 840. Predictions are compared to actual data in an iterative process, and resulting in increasing convergence of baselines on their true value. One example would be the automated algorithmic comparison of changes in impedance data over time to the calendar age-adjustment utilized to compensate a baseline for battery calendar age, with subsequent adjustment to that compensation. Another example would be the automated algorithmic comparison of battery impedance data collected at different, known, states of charge (as determined by non-impedance methods such as coulomb counting), and where a variation in state of charge is known to be a surrogate for a battery condition, to determine a more accurate baseline related to that condition. Yet another example would be the automated algorithmic comparison of battery impedance data collected with the battery at different, known, specific gravities (possibly determined by use of a conductance probe which is an accessory to the testing device 120), and where a variation in specific gravity is known to be a surrogate for a battery condition, to determine a more accurate baseline related to that condition. Further, baselines can be user-critiqued and manually adjusted 850 in specialized software such as that shown in FIG. 4.

In one embodiment of the invention, the battery network is in use to power an electric or hybrid-electric vehicle, such as an automobile, a locomotive, or an industrial crane. Impedance and non-impedance data is acquired from the network of batteries on a continuous or semi-continuous basis. Baselines will be generated and updated by the convergence process automatically, and SOC and SOH conditions determined by comparison of further collected impedance and non-impedance data to the baselines. In this case the testing device may be physically embedded as part of a modular battery network, or battery pack, and may communicate with a computing device in the vehicle to give desired SOC and SOH outputs such as a "fuel gauge" of, for example, range remaining. There may be further communication with a remote server, by wired or wireless means, which may act as a data aggregator from multiple vehicles, provide the ability to further modify baselines, and provide remote monitoring of the battery network SOH and SOC characteristics, as well as having the ability to act on certain cues, such as automatically notifying the user of a developing catastrophic failure condition.

In one embodiment, most suited to continuous embedded monitoring of a network of batteries, and particularly but not exclusively where the battery network is in use to power an electric or hybrid-electric vehicle, such as an automobile, a locomotive, or an industrial crane, the information used to develop baselines comprises a representation of a dynamic response of a battery unit to a known perturbation, where the response is related to a condition of the battery, and where the perturbation is produced by the usage profile or environment to which the battery network is subject, rather than being induced by the measuring instrument. For example, the dynamic response can consist of a change in an impedance parameter, or of battery voltage, in response to a quantified movement of charge into or out of the battery. As a further example, the dynamic response can consist of a change in an impedance parameter in response to a defined change in the state of charge of the battery, or to a quantified change in temperature of the battery. Again, baselines will be generated and updated automatically by the convergence process, and SOC and SOH conditions will be determined by comparison of further collected impedance and non-impedance data to the baselines, but in this case the further collected impedance and non-impedance data will comprise a representation of the dynamic response of a battery unit to a like known perturbation as was used in generating the baselines. Full advantage is taken of both the embedded monitoring capability, and of the presence of secondary perturbations to the battery network, and the batteries comprising the network, which arise by nature of the purpose to which the network is put, and the response of the batteries to which perturbations yield information about SOC and SOH conditions of the batteries and the network which cannot be obtained using a snapshot monitoring technique.

In a variation, the network baselines are generated with the aim of representing a reference value or values for an impedance parameter in a battery at a defined non-ideal SOH or SOC. The data is processed in the same way as previously described to extract information on a battery or network condition. When further testing of the batteries is performed, it is done so with the network of batteries in a like, non-ideal SOH or SOC as to when the baselines were generated. The intention is to amplify the expression of a battery or network condition, and render it more easily detected and measured. For example, if impedance baselines are determined after discharging a network of lead-acid batteries to a marked degree, and further testing of the batteries is performed with the network in a like discharged condition, then the degree of divergence from baseline of individual batteries in a low general SOH will be markedly amplified from that seen if the same process was performed with the network of batteries fully charged. Again, this variation is particularly relevant in the case of continuous embedded monitoring of a network of batteries, and more particularly where the battery network is in use to power an electric or hybrid-electric vehicle, such as an automobile, a locomotive, or an industrial crane. However, the technique may be utilized fully with snapshot data collection, as well.

In another variation, individual-referenced baselines are used to monitor the progress of battery conditioning and reconditioning techniques. For example, current pulses of varying amplitude, duration and frequency may be applied to the terminals of a lead acid battery, or to the main positive and negative terminals of a network of such batteries, for the purpose of reversing sulfation or some other degradation process, or as a general conditioning strategy. Impedance data (for example, from a Fourier transformation performed on the voltage response of the battery to a current pulse) and non-impedance data (for example, the terminal temperatures, as determined by a variety of methodologies, and the temperature differential between the positive and negative terminals) are used to automatically determine an individual-referenced baseline for each battery. Then the progress of the conditioning or reconditioning process may be monitored by comparing impedance and other data, further collected periodically during, and after, the conditioning process, to the baseline. Those skilled in the art will recognize that this progress monitoring can be used to automatically control or guide the conditioning or reconditioning process, increasing its efficacy and efficiency, as well as its ease of application. Advantageously, the baseline used here will be specific and tailored to the technique in use, the instrument used, and to the battery or batteries undergoing the process. Of further advantage, the conditioning process itself may be used to generate the data, and specifically the impedance data, used initially in determining the baseline, and then in monitoring or controlling the process. Note that in this case, although the baseline is possibly a temporary one and representative of the battery at a potentially degraded SOC or SOH, it is generated by the same methods, techniques and logic as are baselines representing an ideal SOC or SOH, and will have equal utility in this specific situation.

In summary, following initial calculation of individual-referenced baselines for the batteries in a network, a population-referenced baseline for the network is calculated, and initial determination of a condition or conditions, comprised of SOC and SOH characteristics, of the batteries of the network, and of the network itself, is performed by comparison of individual-referenced baselines to the population-referenced baseline. Further data is used to refine individual-referenced and/or population-referenced baselines over time by a process of convergence FIG. 8, and this enables the increasingly accurate determination of conditions, comprising SOC and SOH characteristics, of batteries of the network and of the network itself.

What has been described and illustrated herein is a preferred embodiment along with some of its variations. The terms, descriptions and figures used herein are set forth by way of illustration only and are not meant as limitations. Those skilled in the art will recognize that many variations are possible within the spirit and scope of the invention in which all terms are meant in their broadest, reasonable sense unless otherwise indicated. Any headings utilized within the description are for convenience only and have no legal or limiting effect.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The invention claimed is:

1. A method for automatically generating baselines for impedance-based battery testing, the method comprising:
    obtaining individual impedance information for each battery unit in a network of batteries by measuring the response of the battery to a defined electrical excitation signal;
    calculating an individual-referenced baseline for each battery unit from the individual impedance information;
    adjusting the individual-referenced baselines to account for a temperature associated with each battery unit;
    adjusting the individual-referenced baselines to account for a calendar age associated with each battery unit, using a microprocessor; and
    calculating a first population-referenced baseline from the individual-referenced-baselines as adjusted, for a first point in time.

2. The method of claim 1, further comprising:
identifying a deviation from the population-referenced baseline that exceeds a pre-determined threshold and is correlated to a condition.

3. The method of claim 1, further comprising:
determining a condition for a battery in the network of batteries by comparing the individual-referenced baseline of the battery to the population-referenced baseline.

4. The method of claim 3, further comprising:
determining a distribution of the condition within the network of batteries by comparing the individual-referenced baselines of the batteries in the network to the population-referenced baseline.

5. The method of claim 4, further comprising:
determining a condition for the network of batteries as a whole by assessment of the distribution of the condition within the network of batteries.

6. The method of claim 1, further comprising:
calculating a second population-referenced baseline in the same manner as the first, from a second round of gathering individual impedance information at a second point in time occurring subsequent to the first point in time; and
updating the first population-referenced baseline to include data from the second population-referenced baseline.

7. The method of claim 1, further comprising:
receiving a user adjustment to either one of the individual-referenced baselines, or to the population-referenced baseline.

8. The method of claim 7, wherein receiving the user adjustment comprises receiving a reference baseline provided by a manufacturer.

9. The method of claim 1, further comprising:
receiving non-impedance information, and
performing an automated adjustment to either one of the individual-referenced baselines, or to the population-referenced baseline.

10. The method of claim 9, wherein the non-impedance information comprises one or more of a battery voltage, a differential in battery voltage due to a quantified movement of charge into or out of a battery, a battery temperature, a battery terminal temperature, a differential in temperature between battery terminals related to a movement of charge, whether quantified or non-quantified, into or out of a battery, a battery electrolyte specific gravity, a battery or battery network life fraction, a battery amp hour capacity, or a battery or network state of charge as determined by coulomb counting.

11. The method of claim 1, further comprising:
determining a condition for a battery in the network of batteries by comparing impedance information subsequently gathered from the battery to the population-referenced baseline.

12. The method of claim 11, further comprising:
determining a distribution of the condition within the network of batteries by comparing impedance information subsequently gathered from the batteries in the network to the population-referenced baseline.

13. The method of claim 12, further comprising:
determining a condition for the network of batteries as a whole by assessment of the distribution of the condition within the network of batteries.

14. The method of claim 1, further comprising:
determining a condition for an individual battery in the network of batteries by comparing impedance information subsequently gathered from the battery to the individual-referenced baseline for the battery.

15. The method of claim 14, further comprising:
determining the evolution over time of a condition for an individual battery in the network of batteries by comparing impedance information subsequently gathered from the battery on separate occasions over time to the individual-referenced baseline for the battery.

16. The method of claim 1, wherein the impedance information comprises a phase-sensitive vector parameter defined by a magnitude and a phase angle.

17. The method of claim 1, wherein the impedance information comprises a phase-insensitive scalar parameter defined by a single numerical value and unit.

18. The method of claim 1, wherein the impedance information comprises a representation or construct mathematically derived from a measured vector or scalar parameter value or values.

19. The method of claim 1, wherein the impedance information is collected while the network of batteries is at a known, nominally uniform, state of charge that is less than a full state of charge.

20. The method of claim 1, wherein the network of batteries is in active use powering a hybrid-electric or electric automobile, locomotive, or industrial crane.

21. The method of claim 1, wherein the information collected comprises a combination of impedance information and non-impedance information.

22. A method for automatically generating baselines for impedance-based battery testing, the method comprising:
obtaining individual impedance information for each battery unit in a network of batteries by measuring the response of the battery to a defined electrical excitation signal, wherein the impedance information comprises a representation of a dynamic response of an impedance parameter of one of the battery units to a known perturbation, the dynamic response being related to a condition of the battery unit, the perturbation being produced by the usage to which the battery network is subject;
calculating an individual-referenced baseline for each battery unit from the individual impedance information;
adjusting the individual-referenced baselines to account for a temperature associated with each battery unit;
adjusting the individual-referenced baselines to account for a calendar age associated with each battery unit, using a microprocessor; and
calculating a first population-referenced baseline from the individual-referenced-baselines as adjusted, for a first point in time.

23. The method of claim 22, wherein the perturbation consists of a quantified movement of charge into or out of the battery.

24. The method of claim 23, wherein the quantified movement of charge takes place at a known beginning or ending state of charge of the battery.

25. The method of claim 22, wherein the perturbation consists of a quantified change in temperature of the battery.

26. The method of claim 22, wherein the perturbation consists of a quantified change in a temperature differential between a positive and negative terminal pair of the battery.

27. The method of claim 22, further comprising:
identifying a deviation from the population-referenced baseline that exceeds a pre-determined threshold and is correlated to a condition.

28. The method of claim 22, further comprising:
determining a condition for a battery in the network of batteries by comparing the individual-referenced baseline of the battery to the population-referenced baseline.

29. The method of claim 28, further comprising:
determining a distribution of the condition within the network of batteries by comparing the individual-referenced baselines of the batteries in the network to the population-referenced baseline.

30. The method of claim 29, further comprising:
determining a condition for the network of batteries as a whole by assessment of the distribution of the condition within the network of batteries.

31. The method of claim 22, further comprising:
calculating a second population-referenced baseline in the same manner as the first, from a second round of gathering individual impedance information at a second point in time occurring subsequent to the first point in time; and
updating the first population-referenced baseline to include data from the second population-referenced baseline.

32. The method of claim 22, further comprising:
receiving a user adjustment to either one of the individual-referenced baselines, or to the population-referenced baseline.

33. The method of claim 32, wherein receiving the user adjustment comprises receiving a reference baseline provided by a manufacturer.

34. The method of claim 22, further comprising:
receiving non-impedance information, and
performing an automated adjustment to either one of the individual-referenced baselines, or to the population-referenced baseline.

35. The method of claim 34, wherein the non-impedance information comprises one or more of a battery voltage, a differential in battery voltage due to a quantified movement of charge into or out of a battery, a battery temperature, a battery terminal temperature, a differential in temperature between battery terminals related to a movement of charge, whether quantified or non-quantified, into or out of a battery, a battery electrolyte specific gravity, a battery or battery network life fraction, a battery amp hour capacity, or a battery or network state of charge as determined by coulomb counting.

36. The method of claim 22, further comprising:
determining a condition for a battery in the network of batteries by comparing impedance information subsequently gathered from the battery to the population-referenced baseline.

37. The method of 36, further comprising:
determining a distribution of the condition within the network of batteries by comparing impedance information subsequently gathered from the batteries in the network to the population-referenced baseline.

38. The method of 37, further comprising:
determining a condition for the network of batteries as a whole by assessment of the distribution of the condition within the network of batteries.

39. The method of claim 22, further comprising:
determining a condition for an individual battery in the network of batteries by comparing impedance information subsequently gathered from the battery to the individual-referenced baseline for the battery.

40. The method of claim 39, further comprising:
determining the evolution over time of a condition for an individual battery in the network of batteries by comparing impedance information subsequently gathered from the battery on separate occasions over time to the individual-referenced baseline for the battery.

41. The method of claim 22, wherein the impedance information comprises a phase-sensitive vector parameter defined by a magnitude and a phase angle.

42. The method of claim 22, wherein the impedance information comprises a phase-insensitive scalar parameter defined by a single numerical value and unit.

43. The method of claim 22, wherein the impedance information comprises a representation or construct mathematically derived from a measured vector or scalar parameter value or values.

44. The method of claim 22, wherein the impedance information is collected while the network of batteries is at a known, nominally uniform, state of charge that is less than a full state of charge.

45. The method of claim 22, wherein the network of batteries is in active use powering a hybrid-electric or electric automobile, locomotive, or industrial crane.

46. The method of claim 22, wherein the known perturbation is a time dependent voltage.

47. A computer program product comprising
program code stored on a non-transitory computer-readable medium for automatically generating baselines for impedance-based battery testing, the computer product comprising program code for:
obtaining individual impedance information for each battery unit in a network or other population of batteries by utilizing the response of the battery to a defined electrical excitation signal;
calculating an individual-referenced baseline for each battery unit from the individual impedance information;
adjusting the individual-referenced baselines to account for a temperature associated with each battery unit;
adjusting the individual-referenced baselines to account for a calendar age or life fraction associated with each battery unit; and
calculating a first population-referenced baseline from the individual-referenced-baselines as adjusted, for a first point in time.

48. The computer program product of claim 47, further comprising the program code for automatically:
calculating a second population-referenced baseline in the same manner as the first, from a second round of gathering individual impedance information at a second point in time occurring subsequent to the first point in time; and
updating the first population-referenced baseline to include data from the second population-referenced baseline.

49. The computer program product of claim 47, further comprising the computer code for:
receiving a user adjustment to either one of the individual-referenced baselines, or to the population-referenced baseline.

50. The computer program product of claim 49, further comprising the computer code for:
receiving non-impedance information, and
performing an automated adjustment to either one of the individual-referenced baselines, or to the population-referenced baseline.

51. The computer program product of claim 50, wherein the non-impedance information comprises one or more of battery voltage, a differential in battery voltage due to a quantified movement of charge into or out of the battery, battery temperature, battery terminal temperature, a differential in temperature between battery terminals related to a movement of charge, whether quantified or non-quantified, into or out of the battery, electrolyte specific gravity, battery amp hour capacity or battery state of charge as determined by coulomb counting.

52. A system for automatically generating baselines for impedance-based battery testing, system comprising:

means for obtaining individual impedance information for each battery unit in a network or other population of batteries by utilizing the response of the battery to a defined electrical excitation signal;

means for calculating an individual-referenced baseline for each battery unit from the individual impedance information;

means for adjusting the individual-referenced baselines to account for a temperature associated with each battery unit;

means for adjusting the individual-referenced baselines to account for a calendar age or life fraction associated with each battery unit; and means for calculating a first population-referenced baseline from the individual-referenced-baselines as adjusted, for a first point in time.

53. The system of claim 52, further comprising:

means for calculating a second population-referenced baseline in the same manner as the first, from a second round of gathering individual impedance information at a second point in time occurring subsequent to the first point in time; and means for updating the first population-referenced baseline to include data from the second population-referenced baseline.

54. The system of claim 52, further comprising:

means for receiving a user adjustment to either one of the individual-referenced baselines, or to the population-referenced baseline.

55. The system of claim 54, further comprising:

means for receiving non-impedance information, and means for performing an automated adjustment to either one of the individual-referenced baselines, or to the population-referenced baseline.

56. The system of claim 55, wherein the non-impedance information comprises one or more of battery voltage, a differential in battery voltage due to a quantified movement of charge into or out of the battery, battery temperature, battery terminal temperature, a differential in temperature between battery terminals related to a movement of charge, whether quantified or non-quantified, into or out of the battery, electrolyte specific gravity, battery amp hour capacity or battery state of charge as determined by coulomb counting.

\* \* \* \* \*